United States Patent
Yang et al.

(10) Patent No.: US 9,461,106 B1
(45) Date of Patent: Oct. 4, 2016

(54) MIM CAPACITOR AND METHOD FORMING THE SAME

(71) Applicant: Taiwan Semiconductor Manufacturing Company, Ltd., Hsin-Chu (TW)

(72) Inventors: Ching-Jung Yang, Pingzhen (TW); Chang-Pin Huang, Yangmei Township (TW); Hsien-Ming Tu, Zhubei (TW); Hao-Yi Tsai, Hsin-Chu (TW); Mirng-Ji Lii, Sinpu Township (TW); Shih-Wei Liang, Dajia Township (TW); Yu-Chia Lai, Zhunan Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/659,000

(22) Filed: Mar. 16, 2015

(51) Int. Cl.
| H01L 21/00 | (2006.01) |
| H01L 23/00 | (2006.01) |
| H01L 49/02 | (2006.01) |
| H01L 23/535 | (2006.01) |
| H01L 23/544 | (2006.01) |

(52) U.S. Cl.
CPC ............. H01L 28/60 (2013.01); H01L 23/535 (2013.01); H01L 23/544 (2013.01); *H01L 2223/54426* (2013.01)

(58) Field of Classification Search
CPC ....... H01L 28/60; H01L 28/40; H01L 28/88; H01L 28/90; H01L 2223/54426; H01L 23/544; H01L 23/535; H01L 23/50; H01L 23/5383; H01L 21/02063; H01L 21/31053; H01L 21/76224; H01L 21/49822; H01L 21/743; H01L 21/76254; H01L 23/49822; H01L 23/5386; H01L 28/55; H01L 28/91
See application file for complete search history.

(56) References Cited

U.S. PATENT DOCUMENTS

| 6,617,666 | B2* | 9/2003 | Yoshitomi | H01L 21/76834 257/506 |
| 7,115,994 | B2* | 10/2006 | Yaegashi | H01L 27/11502 257/758 |
| 7,371,635 | B2* | 5/2008 | Takaya | H01L 21/84 257/E21.664 |
| 7,838,424 | B2 | 11/2010 | Karta et al. | |
| 7,863,742 | B2 | 1/2011 | Yu et al. | |
| 7,932,601 | B2 | 4/2011 | Chang et al. | |
| 8,754,508 | B2 | 6/2014 | Chen et al. | |
| 8,772,151 | B2 | 7/2014 | Chen | |
| 8,846,548 | B2 | 9/2014 | Tu et al. | |
| 2002/0127792 | A1* | 9/2002 | Yoshitomi | H01L 21/76834 438/239 |
| 2005/0139881 | A1* | 6/2005 | Takaya | H01L 21/84 257/295 |
| 2013/0341800 | A1 | 12/2013 | Tu et al. | |
| 2014/0015122 | A1 | 1/2014 | Chou et al. | |
| 2014/0045379 | A1 | 2/2014 | Chen | |
| 2014/0048926 | A1 | 2/2014 | Wang et al. | |
| 2014/0077356 | A1 | 3/2014 | Chen et al. | |
| 2014/0183693 | A1 | 7/2014 | Tsai et al. | |
| 2014/0187103 | A1 | 7/2014 | Chen et al. | |
| 2014/0252558 | A1 | 9/2014 | Yu et al. | |

(Continued)

*Primary Examiner* — Nikolay Yushin
(74) *Attorney, Agent, or Firm* — Slater Matsil, LLP

(57) ABSTRACT

A package includes an inorganic dielectric layer, and a capacitor. The capacitor includes a bottom electrode having a top surface in contact with a top surface of the inorganic dielectric layer, an insulator over the bottom electrode, and a top electrode over the insulator. The package further includes a polymer layer covering the capacitor, with a portion of the polymer layer being coplanar with the capacitor and encircling the capacitor. The polymer contacts the top surface of the inorganic dielectric layer.

20 Claims, 16 Drawing Sheets

(56) References Cited

U.S. PATENT DOCUMENTS

| | | |
|---|---|---|
| 2014/0252597 A1 | 9/2014 | Tsai et al. |
| 2014/0252601 A1 | 9/2014 | Lu et al. |
| 2014/0252608 A1 | 9/2014 | Chen et al. |
| 2014/0262468 A1 | 9/2014 | Chen et al. |
| 2014/0264885 A1 | 9/2014 | Tsai et al. |
| 2015/0351247 A1* | 12/2015 | Kwon .................. H05K 1/186 361/761 |

\* cited by examiner

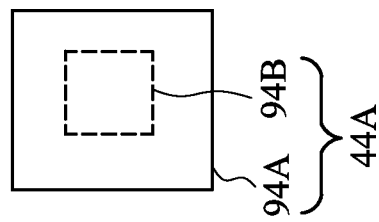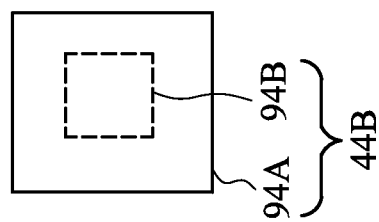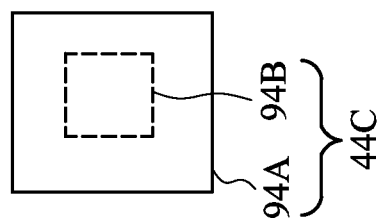
Fig. 13B

MIM CAPACITOR AND METHOD FORMING THE SAME

BACKGROUND

Metal-Insulator-Metal (MIM) capacitors have been widely used in functional circuits such as mixed signal circuits, analog circuits, Radio Frequency (RF) circuits, Dynamic Random Access Memories (DRAMs), embedded DRAMs, and logic operation circuits. In system-on-chip applications, different capacitors for different functional circuits have to be integrated on a same chip to serve different purposes. For example, in mixed-signal circuits, capacitors are used as decoupling capacitors and high-frequency noise filters. For DRAM and embedded DRAM circuits, capacitors are used for memory storage, while for RF circuits, capacitors are used in oscillators and phase-shift networks for coupling and/or bypassing purposes. For microprocessors, capacitors are used for decoupling. The traditional way to combine these capacitors on a same chip is to fabricate them in different metal layers.

Decoupling capacitors are used to decouple some parts of electrical networks from others. Noise caused by certain circuit elements is shunted through the decoupling capacitors, hence reducing the effect of the noise-generating circuit elements on adjacent circuits. In addition, Decoupling capacitors are also used in power supplies, so that the power supplies may accommodate the variations in current-draw, so that the variation in power supply voltage is minimized. When the current-draw in a device changes, the power supply itself cannot respond to the change instantaneously. The decoupling capacitors thus may act as power storages to maintain power supply voltages in response to the current-draw at frequencies ranging from hundreds of kilo-hertz to hundreds of mega-hertz.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
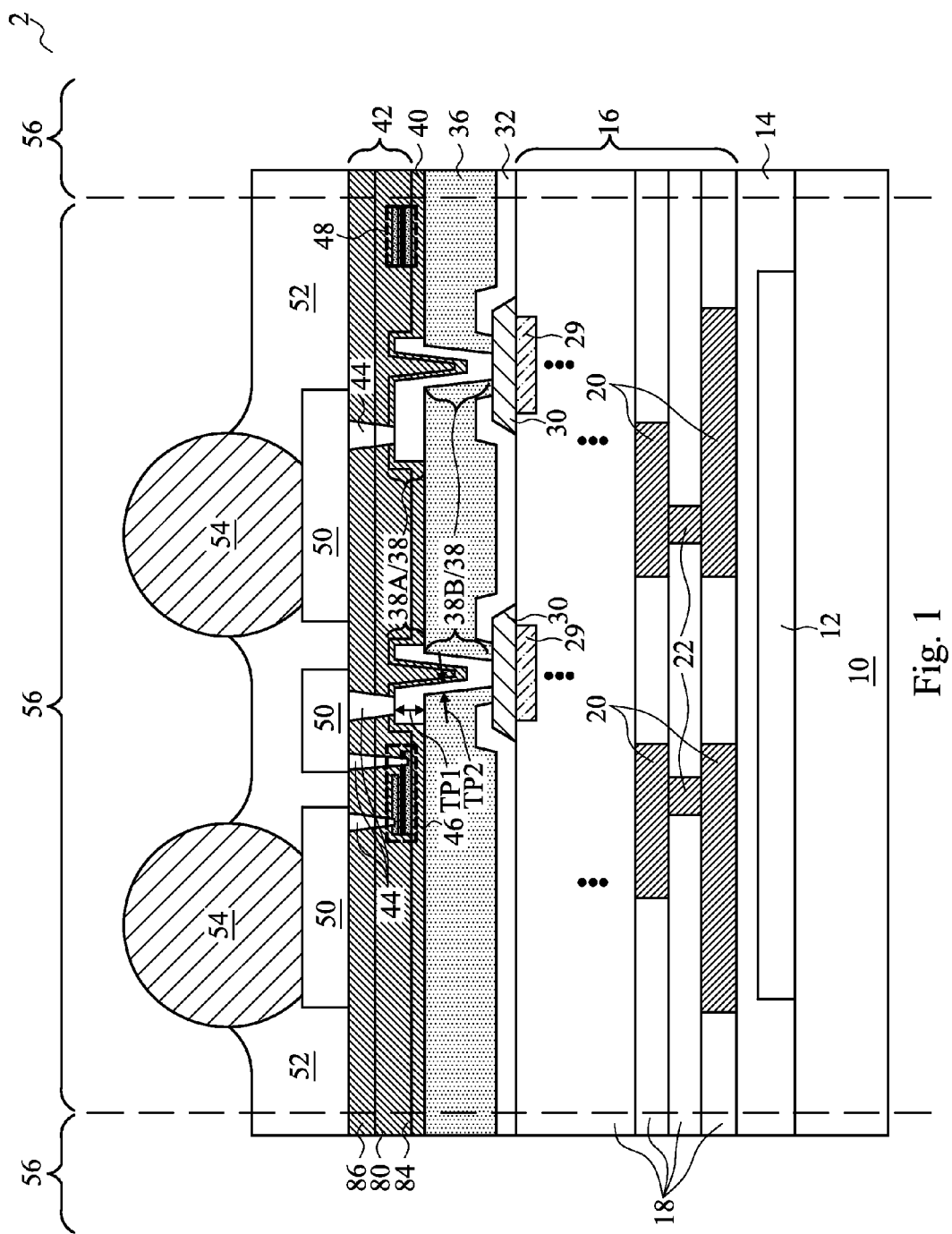
FIG. 1 illustrates a cross-sectional view of a package in accordance with some embodiments, wherein a capacitor is formed in a top polymer layer in the package.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A package and the method of forming the same are provided in accordance with various exemplary embodiments. The intermediate stages of forming the package are illustrated. The variations of the embodiments are discussed. Throughout the various views and illustrative embodiments, like reference numbers are used to designate like elements.

Referring to FIG. 1, wafer 2, which includes semiconductor substrate 10, is provided. Semiconductor substrate 10 may be a bulk silicon substrate or a silicon-on-insulator substrate. Alternatively, other semiconductor materials that include group III, group IV, and/or group V elements may also be used, which may include silicon germanium, silicon carbon, and/or III-V compound semiconductor materials. Integrated circuit devices such as transistors (schematically illustrated as 12) are formed at a surface of semiconductor substrate 10. Wafer 2 may further include Inter-Layer Dielectric (ILD) 14 and interconnect structure 16 over semiconductor substrate 10. Interconnect structure 16 includes metal lines 20 and vias 22, which are formed in dielectric layers 18. The metal lines at a same level are collectively referred to as a metal layer hereinafter. Accordingly, interconnect structure 16 may include a plurality of metal layers that are interconnected through vias 22. Metal lines 20 and vias 22 may be formed of copper or copper alloys, although they can also be formed of other metals. In accordance with some embodiments of the present disclosure, dielectric layers 18 comprise low-k dielectric materials. The dielectric constants (k values) of the low-k dielectric materials may be lower than about 3.0, or lower than about 2.5, for example.

Metal pads 30 are formed over interconnect structure 16, and may be electrically couple to integrated circuit devices 12 through metal lines 20 and vias 22. Metal pads 30 may be aluminum pads or aluminum-copper pads, and hence are alternatively referred to as aluminum pads 30 hereinafter, while other metallic materials may be used. For example, metal pads 30 may have an aluminum (atomic) percentage between about 99.5 percent and about 99.9 percent, and a copper percentage between about 0.1 percent and about 0.5 percent. In accordance with some embodiments of the present disclosure, metal pads 30 are in physical contact with the underlying metal lines (or pads) in the top metal layer in interconnect structure 16. For example, as shown in FIG. 1, metal pads 30 have bottom surfaces in contact with the top surfaces of metal pads 29.

As also shown in FIG. 1, passivation layer 32 is formed over interconnect structure 16. Passivation layer 32 has a k value greater than 3.8, and is formed using a non-low-k dielectric material. In accordance with some embodiments of the present disclosure, passivation layer 32 is a composite layer comprising a silicon oxide layer (not shown), and a silicon nitride layer (not shown) over the silicon oxide layer. Passivation layer 32 may also be formed of other non-porous dielectric materials such as Un-doped Silicate Glass (USG), silicon oxynitride, and/or the like.

Passivation layer 32 is patterned, so that some portions of passivation layer 32 cover the edge portions of aluminum pads 30, and the central portions of aluminum pads 30 are exposed through the openings in passivation layer 32. Passivation layer 32 and metal pads 30 have some portions level with each other in accordance with some embodiments of the present disclosure.

Polymer layer 36 is formed over metal pads 30 and passivation layer 32. Polymer layer 36 is also patterned to form openings, with the central portions of metal pads 30 exposed through the openings in polymer layer 36. In accordance with some embodiments of the present disclosure, polymer layer 36 is formed of polybenzoxazole (PBO). In alternative embodiments, polymer layer 36 is formed of other polymers such as polyimide, benzocyclobutene (BCB), or the like. The material of polymer layer 36 may be photo sensitive, although non-photo-sensitive materials may also be used.

Post-Passivation Interconnect (PPI) 38 is formed to have line portions 38A (referred to as PPI lines) over polymer layer 36, and via portions 38B (referred to as PPI vias) extending into polymer layer 36. PPI lines 38A are thus electrically connected to metal pads 30.

Dielectric layers 40 and polymer layer 42 are formed over polymer layer 36 and PPI 38. In accordance with some embodiments of the present disclosure, dielectric layers 40 are formed of inorganic dielectric materials including silicon oxide, silicon carbide, silicon oxycarbide, silicon nitride, or the like. Furthermore, dielectric layers 40 may include two or more layers formed of different materials. For example, dielectric layers 40 may be formed of a silicon carbide layer and a silicon oxide layer over the silicon carbide layer.

Polymer layer 42 is formed over dielectric layer 40, and is also patterned to form openings, with vias 44 formed in the openings. In accordance with some embodiments of the present disclosure, polymer layer 42 is formed of PBO. In alternative embodiments, polymer layer 42 is formed of other polymers such as polyimide, BCB, or the like. The material of polymer layer 36 may be photo sensitive, although non-photo-sensitive materials may also be used. Polymer layer 42 and polymer layer 36 may be formed of a same type of polymer, or may be formed of different types of polymers.

In accordance with some embodiments of the present disclosure, capacitor 46 and alignment mark 48 are embedded in polymer layer 42. The bottom surfaces of capacitor 46 and alignment mark 48 may be in contact with the top surface of dielectric layers 40. Capacitor 46 and alignment mark 48 may have a same layered structure, with each of the layers in capacitor 46 having a corresponding layer in alignment mark 48, and vice versa. Alignment mark 48 may be electrically floating. In accordance with some embodiments of the present disclosure, capacitor 46 is a decoupling capacitor, with the top electrode and the bottom electrode of capacitor 46 being electrically coupled to power supply lines such as VDD and VSS, respectively. Accordingly, capacitor 46 is used to filter noise and also used as a power storage for reducing the voltage variation resulted from the current-drawn from the power source. In accordance with alternative embodiments of the present disclosure, the top electrode and the bottom electrode of capacitor 46 are connected to signal lines, and capacitor 46 is used to filter noise. The top electrode and the bottom electrode of capacitor 46 are connected to vias 44, which extend to the top surface of polymer layer 42.

PPI 50 is formed over polymer layer 42, and is electrically connected to vias 44. PPI 50 includes a plurality of redistribution lines. In accordance with some embodiments of the present disclosure, PPI 50 and PPI 38 differ in structures. For example, PPI 38 includes PPI lines 38A and vias 38B, which are formed simultaneously using the same material(s). Accordingly, PPI lines 38A are continuously connected to the respective vias 38B, with no distinguishable interfaces between PPI lines 38A and the respective vias 38B. PPI lines 38A and vias 38B form conformal features, with thickness TP1 of PPI lines 38A and thickness TP2 of vias 38B substantially equal to each other, for example, with difference smaller than about 20 percent. On the other hand, the entireties (or substantially entireties) of PPI 50 may be over polymer layer 42. PPI 50 and vias 44 are formed in different processes, and may be formed of different materials. Accordingly, there may be distinguishable interfaces between PPI 50 and the respective connecting vias 44. In addition, the top surfaces of PPI vias 38B are not flat, and may include portions lower than the top surfaces of PPI lines 38A, or even lower than the top surface of polymer layer 36. On the other hand, the top surfaces of PPI 50 are substantially planar.

Figure 13A:
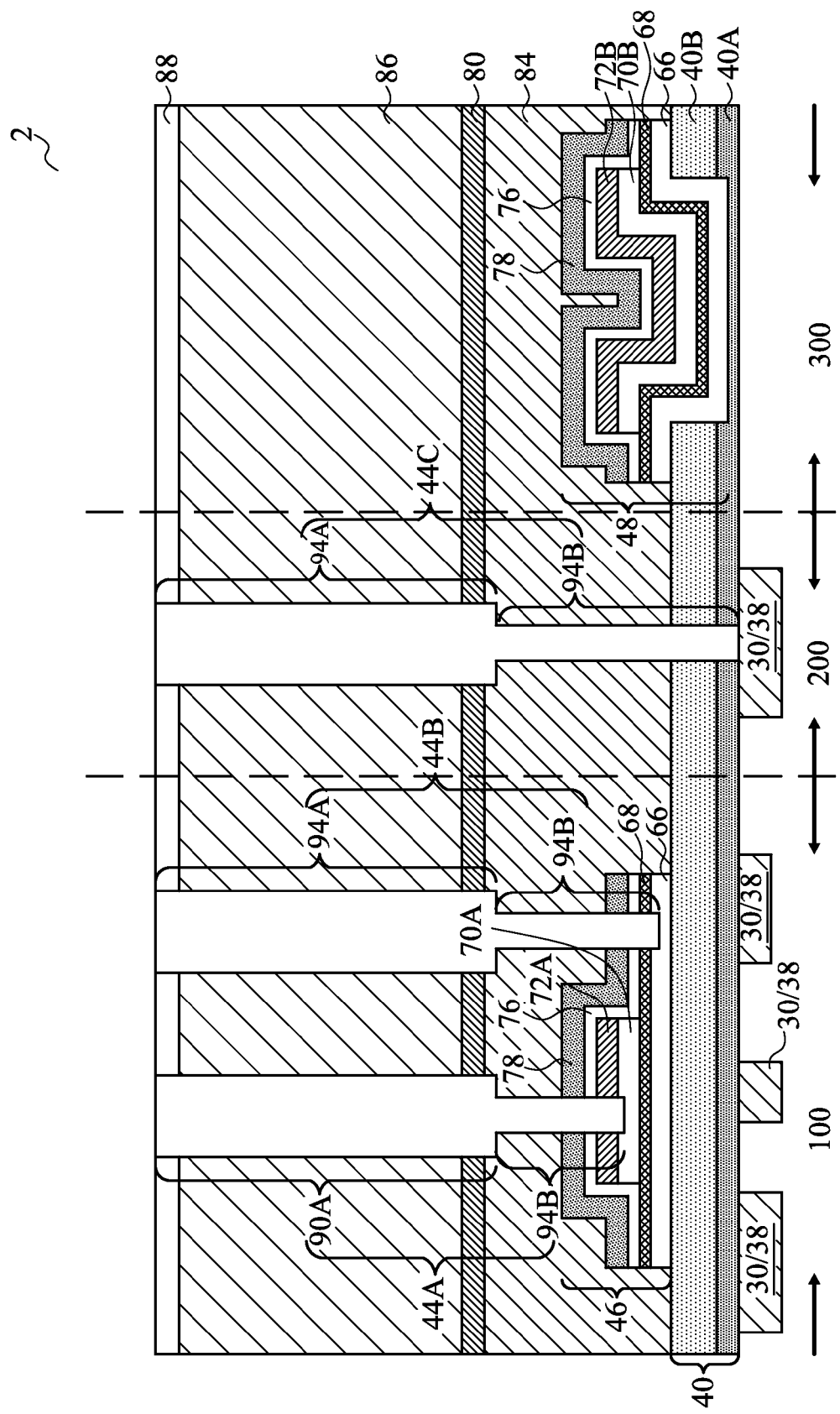
Figure 14:
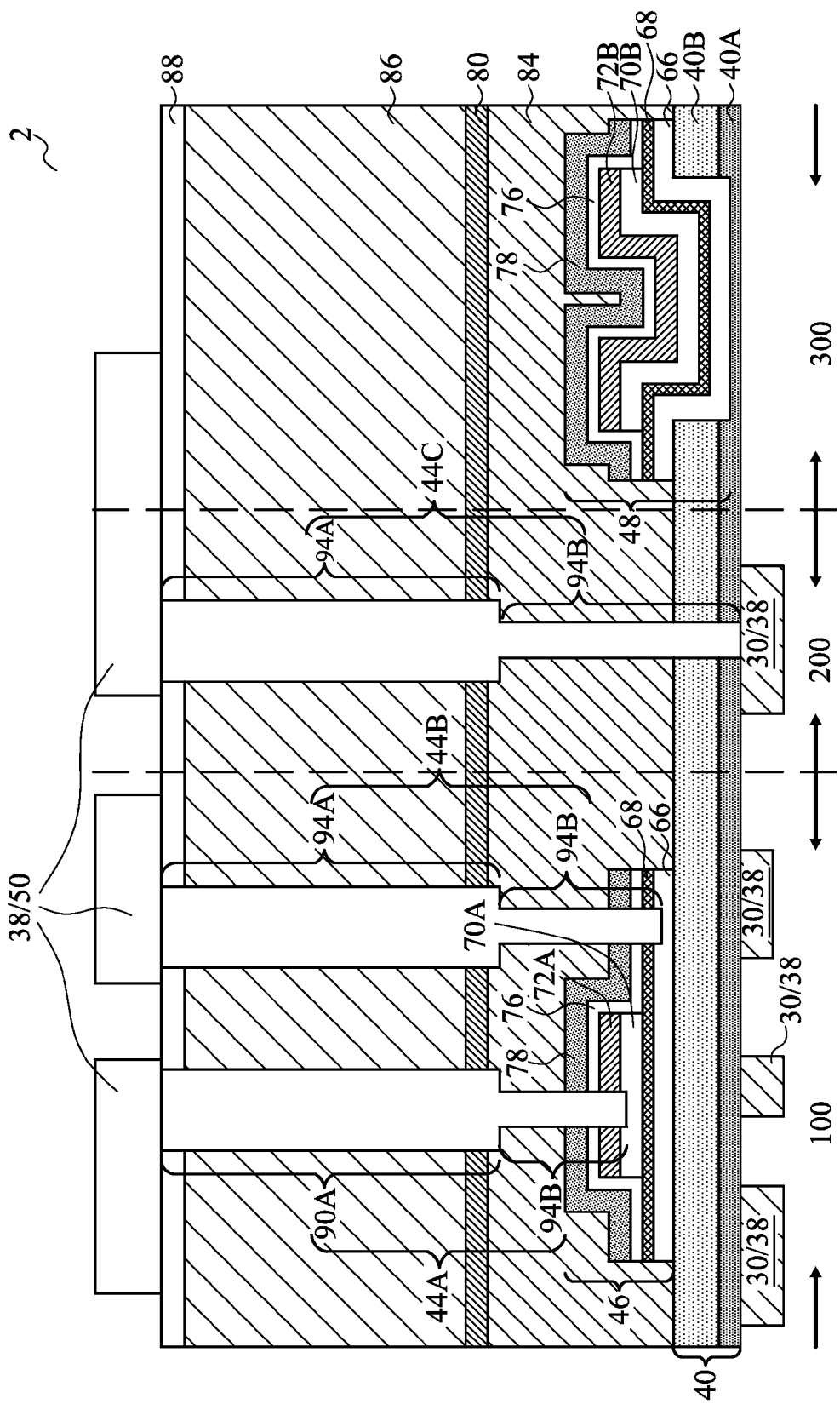

The difference in the structures of PPI 38 and PPI 50 are resulted from their difference in formation processes. For example, the formation of PPI 38 may include forming a blanket seed layer (not shown) over polymer layer 36 and extending into the openings in polymer layer 36, forming a mask (not shown) to cover some portions of the blanket seed layer, and performing a plating. After the plating, the mask layer is removed, and the portions of the seed layer covered by the mask layer are removed, leaving PPI 38. The top surface of PPI 38 thus has a topology following the topology of polymer layer 36 and the openings in polymer layer 36. On the other hand, vias 44 and PPI 50 are formed separately, as shown in FIGS. 13A and 14, and hence vias 44 have top surfaces substantially level with the top surface of polymer layer 42. As a result, PPI 50 can have substantially planar top surfaces.

In accordance with some embodiments, PPI 50 is in molding compound 52, which encircles PPI 50, and contacts the top surface of polymer layer 42. The top surfaces and sidewalls of PPI 50 may also be in physical contact with molding compound 52.

In accordance with some embodiments of the present disclosure, electrical connectors 54 are formed to electrically connect to PPI 50. Electrical connectors 54 may include metal regions, which may include solder balls placed on PPI 50. Electrical connectors 54 may also include metal pillars. In the embodiments electrical connectors 54 include solder, the solder may be placed or plated, and the plating of solder may be similar to the formation of PPI 38. Electrical connectors 54 have upper portions over the top surface of molding compound 52, and lower portions embedded in molding compound 52.

After the formation of electrical connectors 54, wafer 2 may be sawed into individual packages 56, each including one capacitor 46 and integrated circuit device 12.

Figure 2:
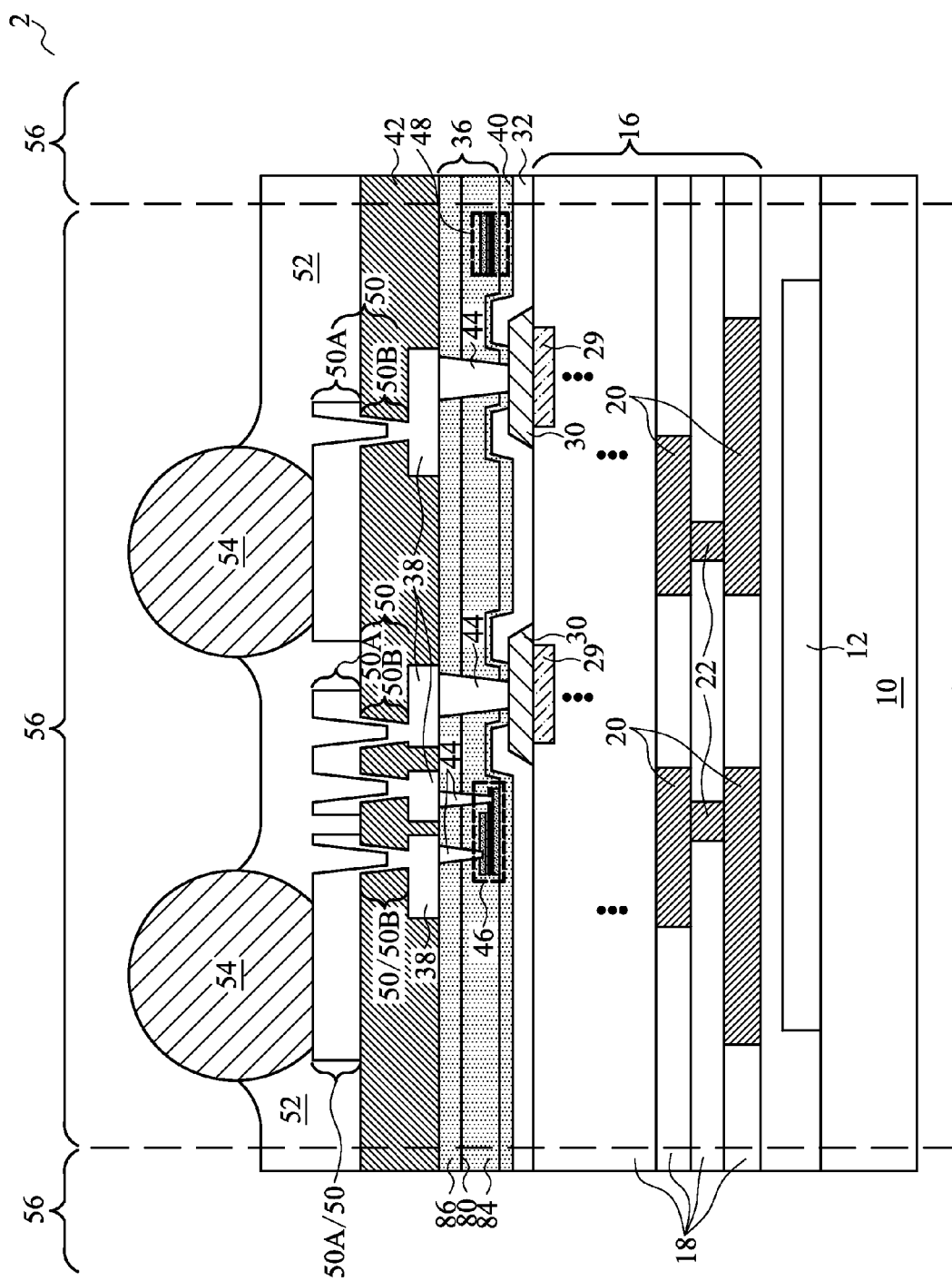
FIG. 2 illustrates a cross-sectional view of a package in accordance with some embodiments, wherein a capacitor is formed in a polymer layer underlying the top polymer layer in the package.

FIG. 2 illustrates a cross-sectional view of wafer 2 in accordance with alternative embodiments of the present disclosure. Unless specified otherwise, the materials and the formation methods of the components in these embodiments are essentially the same as the like components, which are denoted by like reference numerals in the embodiments shown in FIG. 1. The details regarding the formation process and the materials of the components shown in FIG. 2 may thus be found in the discussion of the embodiments shown in FIG. 1.

The wafer 2 as shown in FIG. 2 differs from the wafer 2 in FIG. 1 in that capacitor 46 and alignment mark 48 are formed in polymer layer 36, rather than in polymer layer 42. Accordingly, dielectric layers 40 are formed underlying polymer layer 36, rather than underlying polymer layer 42. The top surface of polymer layer 36 may be in contact with the bottom surface of polymer layer 42 in these embodiments.

Capacitor 46 has a bottom surface in contact with the top surface of dielectric layers 40. Furthermore, capacitor 46 is encircled by, and is also covered by, polymer layer 36. Some of vias 44 are formed in polymer layer 36 to connect to the top electrode and the bottom electrode of capacitor 46. Additional vias 44 are formed to extend into both dielectric layers 40 and polymer layer 36 to electrically connect to metal pads 30.

In accordance with the embodiments shown in FIG. 2, PPI 50 and PPI 38 also differ in structures. For example, PPI 50 includes PPI lines 50A and vias 50B, which are formed simultaneously using the same material(s). Accordingly, PPI lines 50A are continuously connected to the respective vias 50B, with no distinguishable interfaces between PPI lines 50A and the respective vias 50B. On the other hand, the entireties of PPI 38 (which includes a plurality of redistribution lines) may be over polymer layer 36. PPI 38 and vias 44 are formed in different processes, and may be formed of different materials. Accordingly, there may be distinguishable interfaces between PPI 38 and the respective connecting vias 44. In addition, the top surfaces of PPI vias 50B are not planar, and may include portions lower than the top surfaces of PPI lines 50A, or even lower than the top surface of polymer layer 42. On the other hand, the top surfaces of vias 44 are substantially planar.

Figure 15:
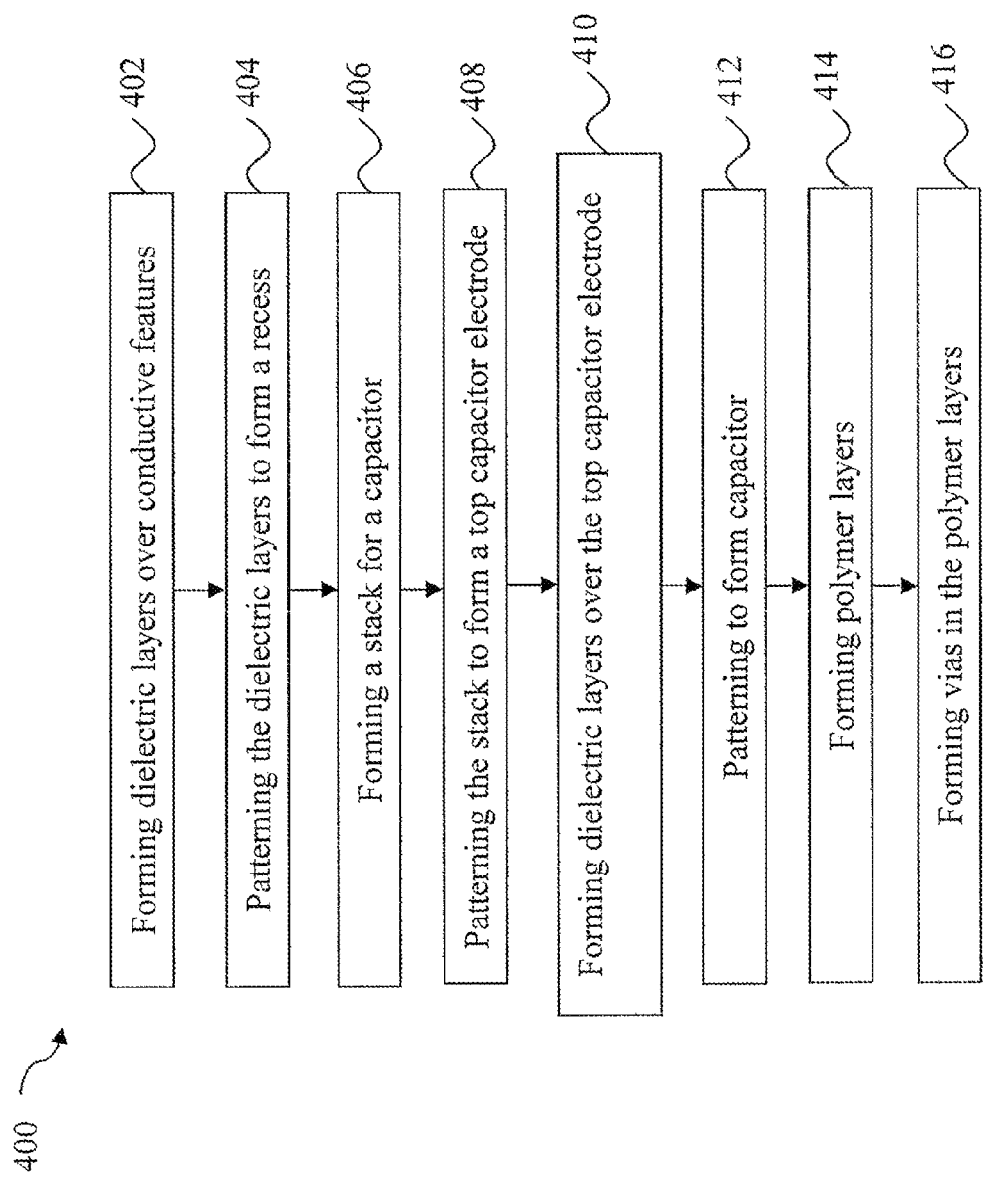
FIG. 15 illustrates a process flow for forming a capacitor in a polymer layer in accordance with some embodiments.

FIGS. 3 through 14 illustrate the cross-sectional views and a top view of intermediate stages in the formation of some portions of wafer 2 in accordance with some embodiments. The portions shown in FIGS. 3 through 14 include the portions of capacitor 46, alignment mark 48, and some overlying and underling portions. The steps shown in FIG. 3 through 14 are also illustrated schematically in the process flow shown in FIG. 15. In the subsequent discussion, the process steps shown in FIGS. 3 through 14 are discussed referring to the process steps in FIG. 15.

Figure 3:
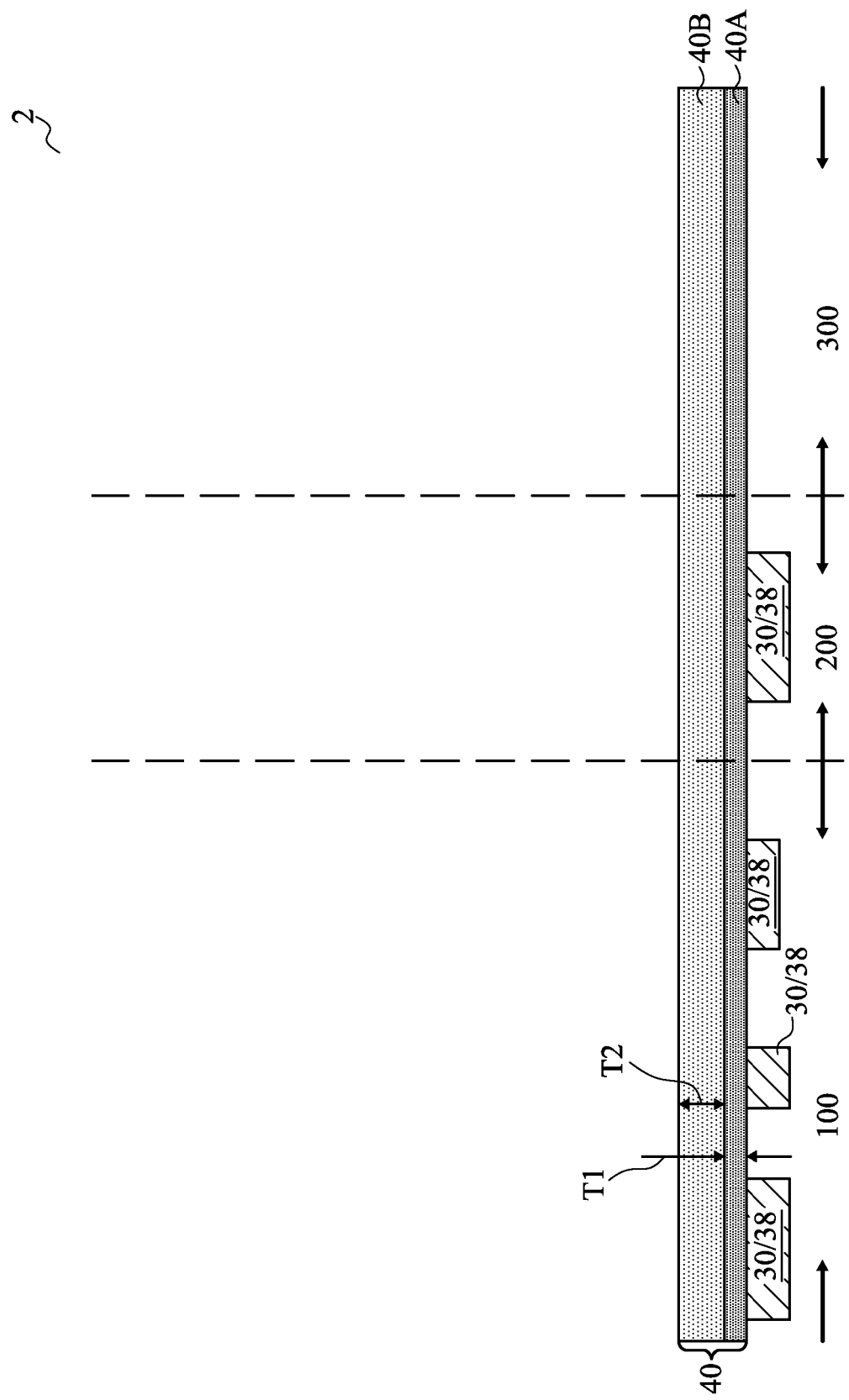
FIGS. 3 through 14 illustrate cross-sectional views and a top view of intermediate stages in the formation of package in accordance with some embodiments.

Referring to FIG. 3, wafer 2 includes capacitor region 100 for forming a capacitor therein, logic region 200 for forming the electrical connections connected to logic (core) devices 12 (FIGS. 1 and 2), and alignment mark region 300 for forming an alignment mark therein. Conductive features 30/38 are provided. The portions of wafer 2 underlying or coplanar with conductive features 30/38 are not illustrated. In the embodiments shown in FIG. 1, conductive features 30/38 are portions of PPI 38. In the embodiments in FIG. 2, conductive features 30/38 are portions of metal pads 30.

Dielectric layers 40 are formed over conductive features 30/38. The respective step is shown as step 402 in process flow 400 illustrated in FIG. 15. It is appreciated that although FIG. 3 illustrates that dielectric layers 40 are planar layers, dielectric layers 40 may actually have the topology as shown in FIG. 1 or 2. Dielectric layers 40 include dielectric layer 40A and dielectric layer 40B over dielectric layer 40A. Dielectric layers 40A and 40B are formed of different materials, which may be inorganic materials in accordance with some embodiments. For example, dielectric layer 40A may be formed of SiC. Thickness T1 of dielectric layer 40A may be in the range between about 400 Å and about 700 Å. Dielectric layer 40B may be formed of silicon oxide. Thickness T2 of dielectric layer 40B may be in the range between about 800 Å and about 1,200 Å. Dielectric layers 40A and 40B may be formed using Plasma Enhance Chemical Vapor Deposition (PECVD), Low-Pressure Chemical Vapor Deposition (LPCVD), Atomic Layer Deposition (ALD), or the like.

Figure 4:
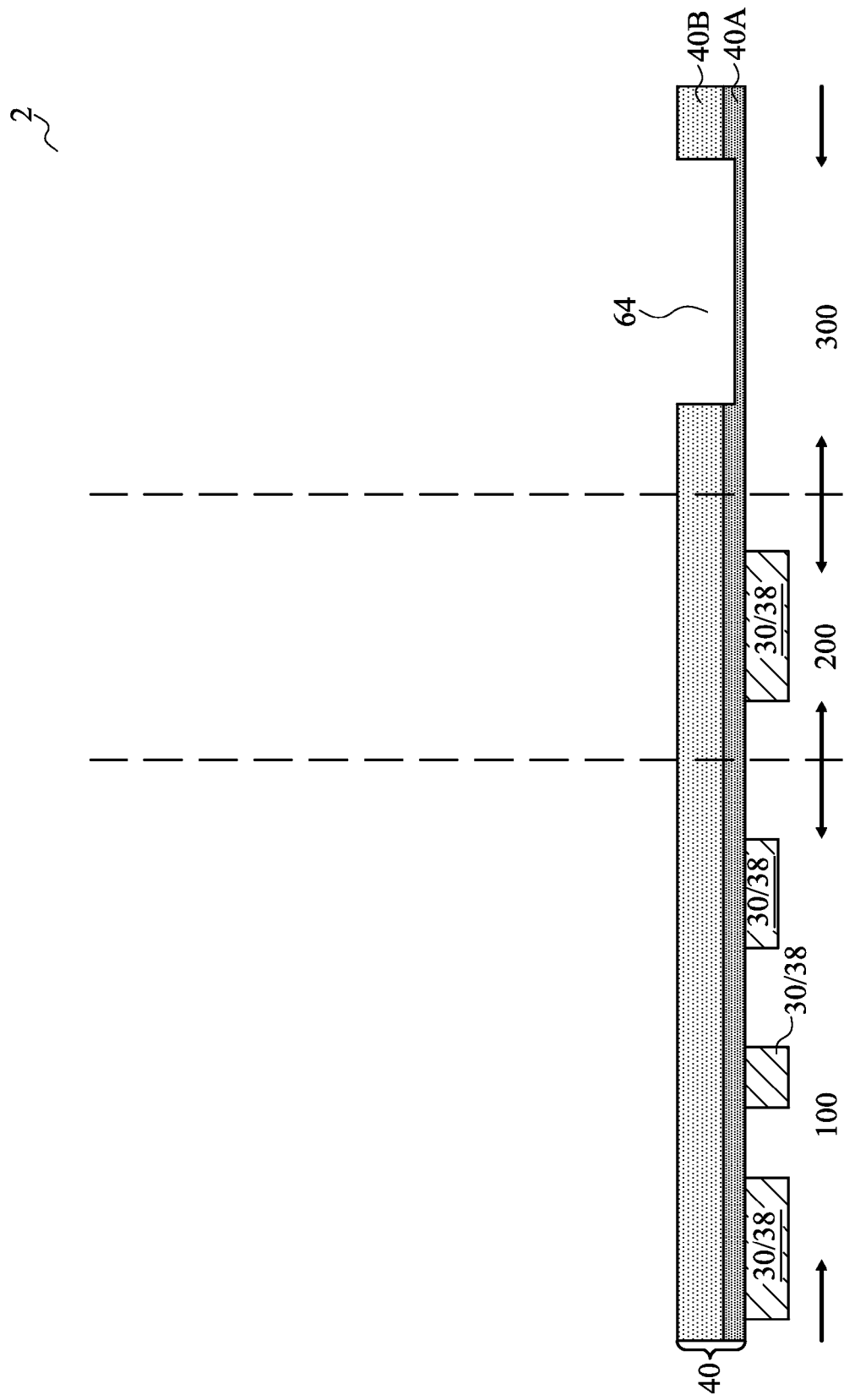

Referring to FIG. 4, a portion of dielectric layer 40B is etched to form recess 64. The respective step is shown as step 404 in process flow 400 illustrated in FIG. 15. Dielectric layer 40A is used as the etch stop layer, and hence a top surface of dielectric layer 40A is exposed to recess 64. The top-view of recess 64 may have a shape that can be easily identified, wherein the available shapes include cross, triangle, hexagon, or the like.

Figure 5:
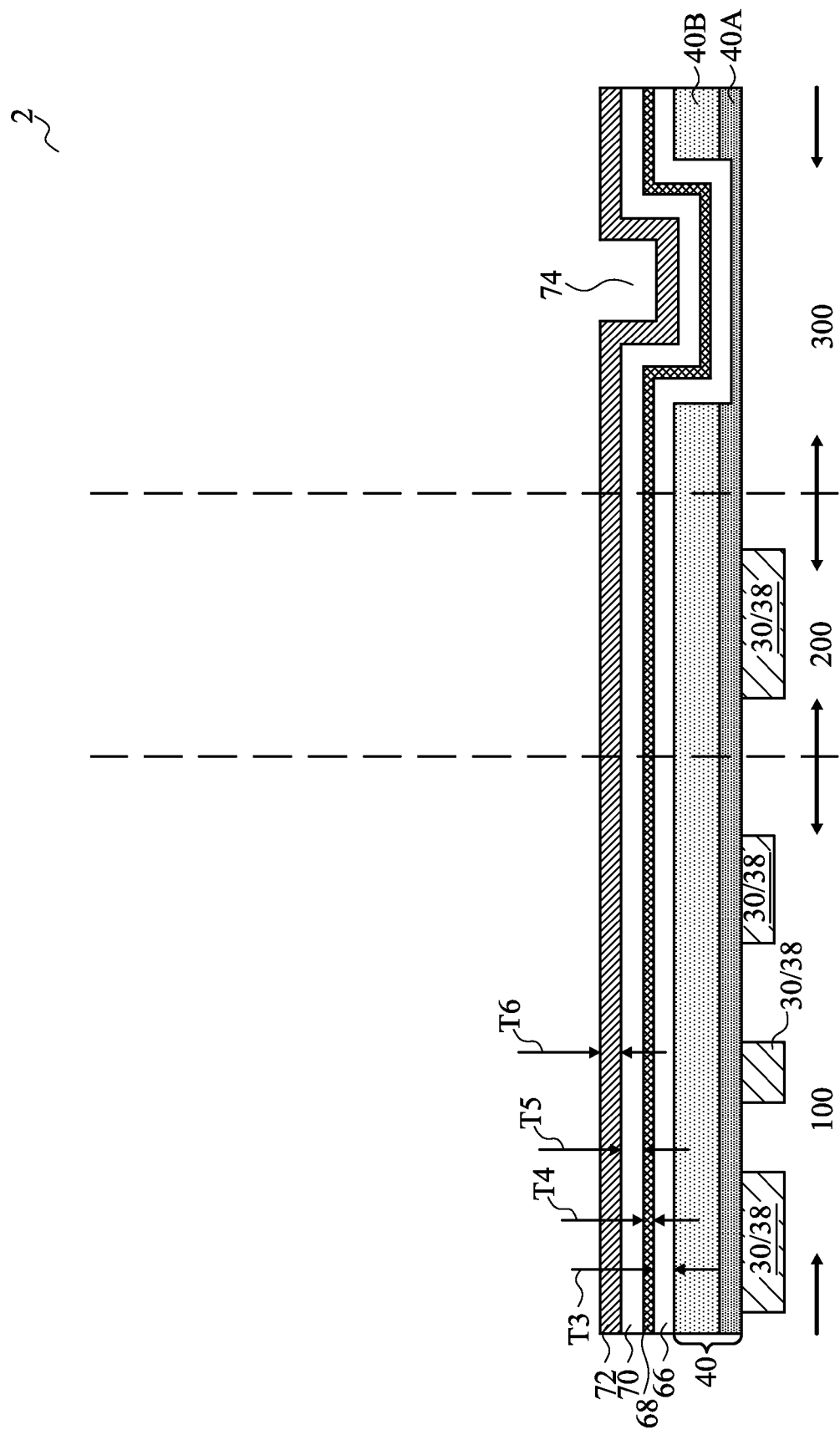

Next, referring to FIG. 5, a plurality of layers 66, 68, 70, and 72 are formed as a stack, and are formed as blanket layers. The respective step is shown as step 406 in process flow 400 illustrated in FIG. 15. In accordance with some exemplary embodiments of the present disclosure, conductive layer 66 is formed of TiN, which has thickness T3 in the range between about 300 Å and about 500 Å. Dielectric layer 68 may be formed of stacked layers $ZrO_2/Al_2O_3/ZrO_2$ (ZAZ), which has thickness T4 in the range between about 80 Å and about 120 Å. ZAZ has the advantageous feature of having a low equivalent oxide thickness, and hence the capacitance value of the resulting capacitor is high. Conductive layer 70 may be formed of TiN, which has thickness T5 in the range between about 300 Å and about 500 Å. Layer 72, which is an anti-reflective coating, may be formed of SiON, which has thickness T6 in the range between about 250 Å and about 350 Å. Stacked layers 66, 68, 70, and 72 extend into recess 64 (FIG. 4), and hence stacked layers 66, 68, 70, and 72 form recess 74 in alignment mark region 300.

Figure 6:
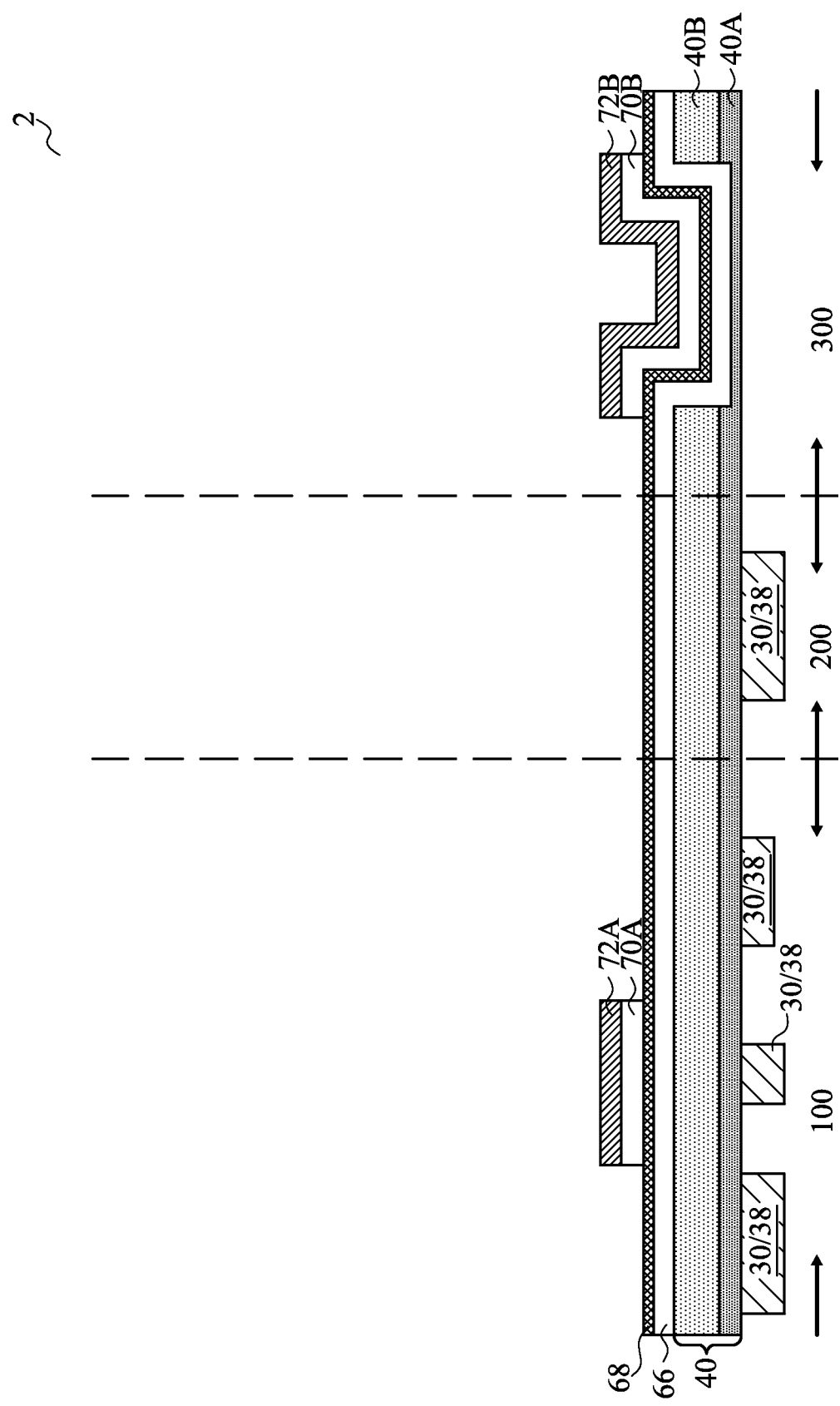

Layers 70 and 72 are patterned in a photolithography process to form a top electrode. The respective step is shown as step 408 in process flow 400 illustrated in FIG. 15. As shown in FIG. 6, the patterned layers 70 and 72 have remaining portions 70A and 72A, respectively, in capacitor region 100. The patterned layers 70 and 72 further have remaining portions 70B and 72B, respectively, in alignment mark region 300. During the patterning, layer 72 may be used as an anti-reflective coating. Furthermore, during the photolithography process, recess 74 as shown in FIG. 5 is used as an alignment mark to align the position of the photolithography mask, and the position of the patterned portions 70A and 72A is determined using the alignment mark.

Figure 7:
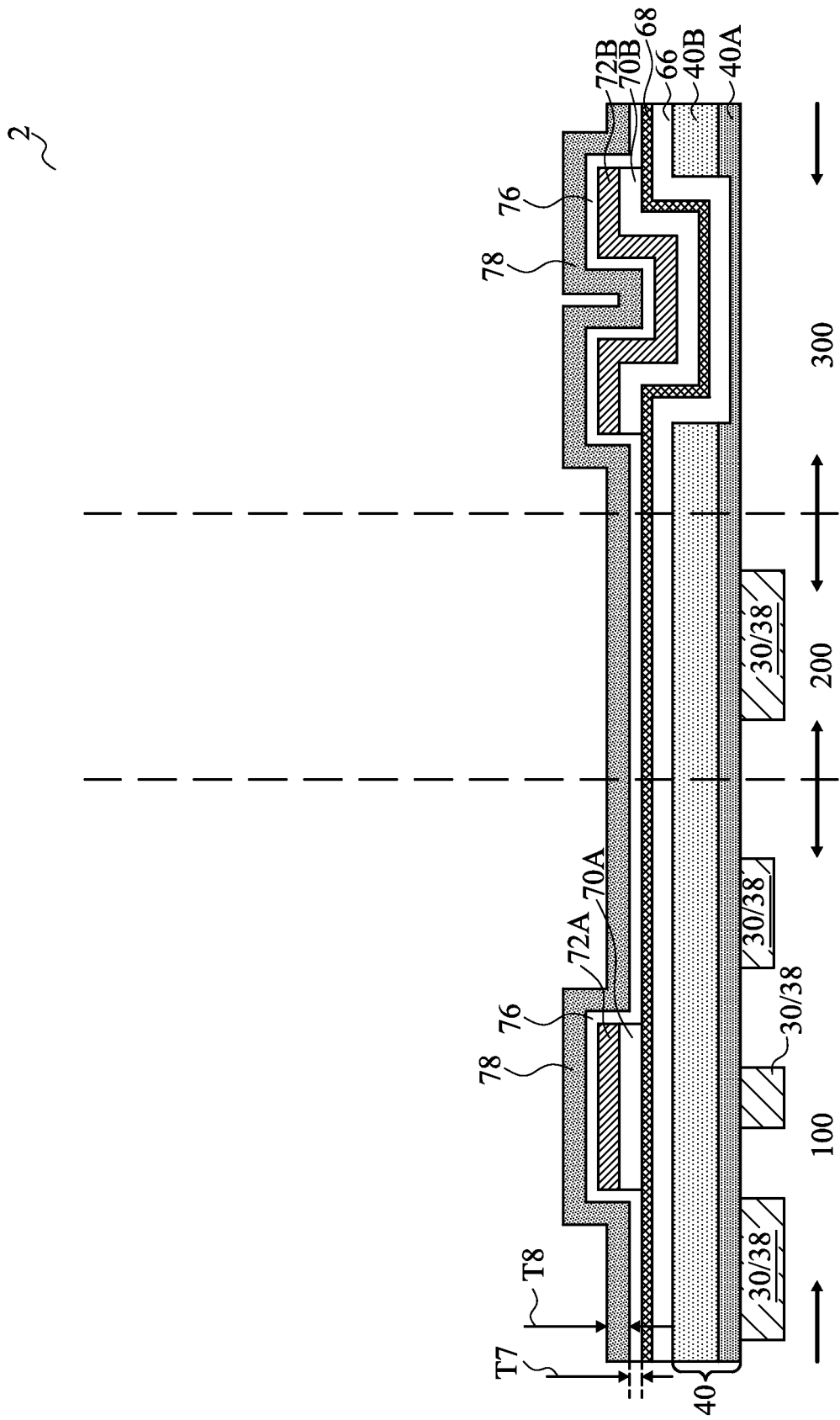

Next, as shown in FIG. 7, dielectric layers 76 and 78 are formed. The respective step is shown as step 410 in process flow 400 illustrated in FIG. 15. In accordance with some exemplary embodiments of the present disclosure, dielectric layer 76 is formed of silicon oxide, which has thickness T7 in the range between about 150 Å and about 250 Å. Dielectric layer 78 may be formed of SiN, which has thickness T8 in the range between about 400 Å and about 600 Å.

Figure 8:
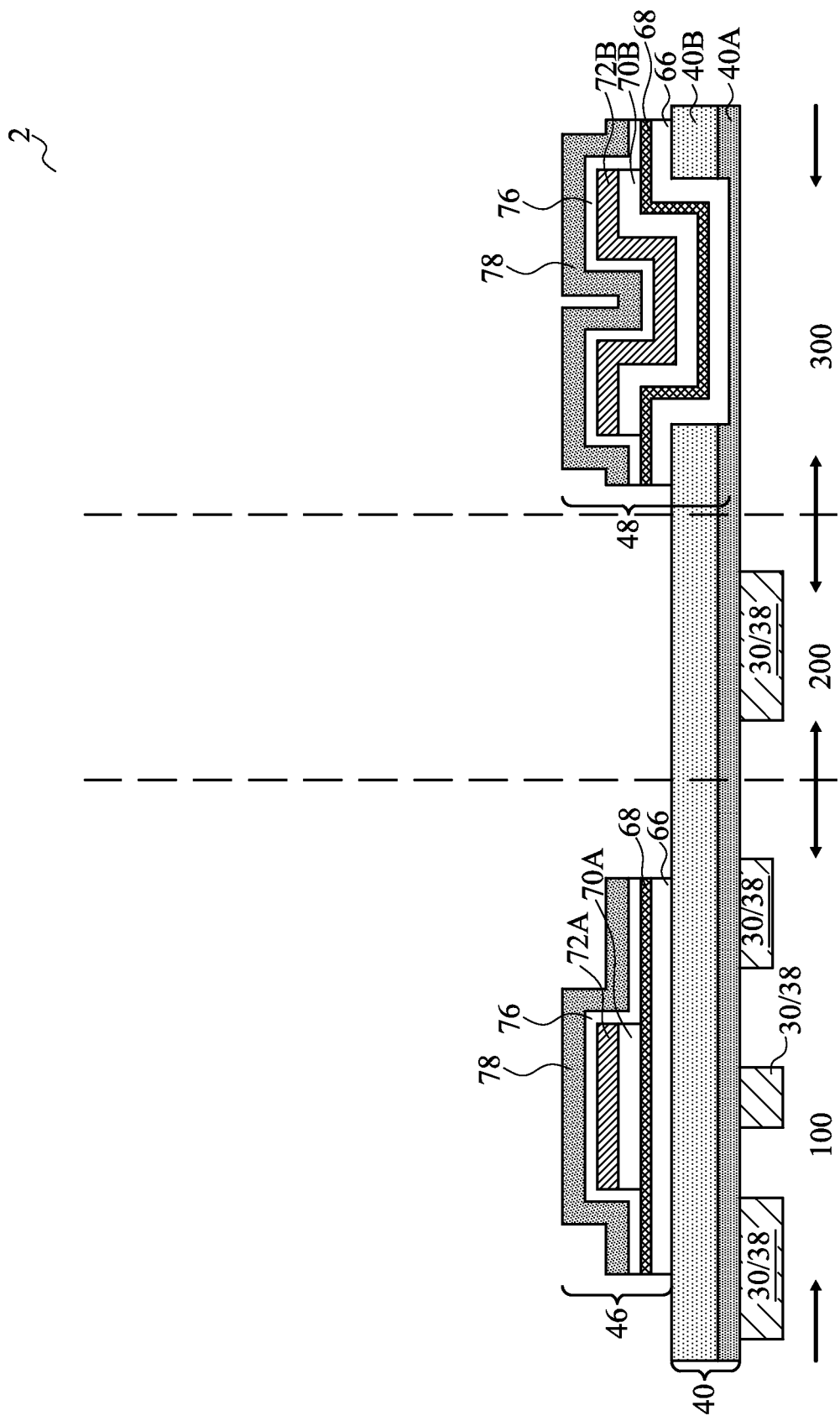

FIG. 8 illustrates the further patterning of layers 66, 68, 76, and 78. The respective step is shown as step 412 in process flow 400 illustrated in FIG. 15. The patterned layers in capacitor region 100 thus form capacitor 46. In capacitor 46, layers 66, 68, and 70A are the bottom capacitor electrode, capacitor insulator, and the top capacitor electrode, respectively. Capacitor 46 is thus a Metal-Insulator-Metal (MIM) capacitor.

Furthermore, in the alignment mark region 300, alignment mark 48 is formed. Since alignment mark 48 is formed simultaneously as capacitor 46, capacitor 46 and alignment mark 48 may have same number of layers, with each layer in capacitor 46 corresponding to one of the layers in alignment mark 48, and vice versa. Furthermore, alignment mark 48 may have a first bottom surface in contact with a top surface of dielectric layer 40B, and a second bottom surface in contact with a top surface of dielectric layer 40A, with a portion of alignment mark 48 penetrating through dielectric layer 40A. The resulting alignment mark 48 is formed as an isolated feature isolated from other conductive features.

Figure 9:
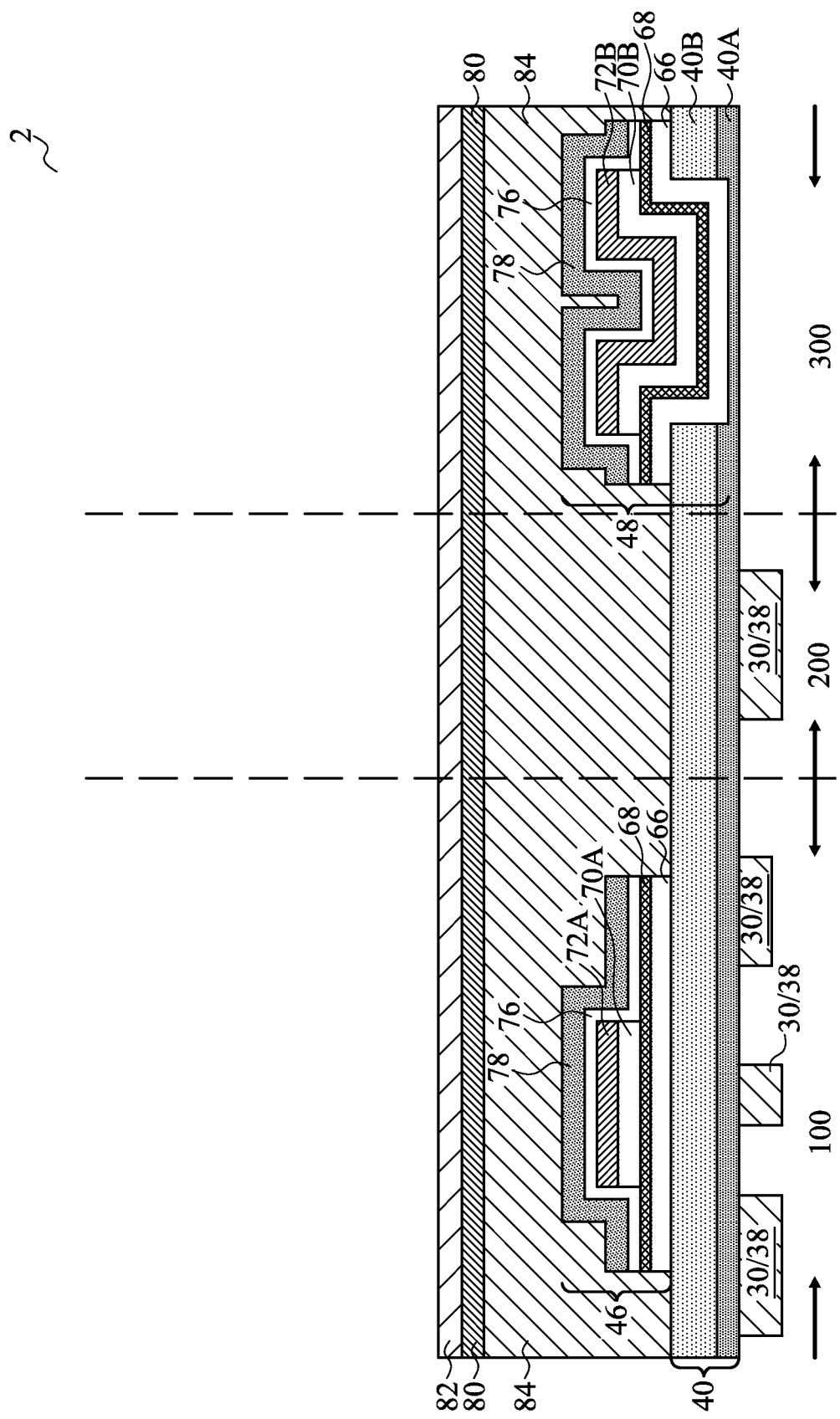

Next, as shown in FIG. 9, polymer layer 84 is formed. Polymer layer 84 may be the lower portion of the polymer layer 42 in the embodiments shown in FIG. 1, or the lower portion of polymer layer 36 in the embodiments shown in FIG. 2. Alignment mark 48 is fully embedded in dielectric layers including polymer layer 84 and dielectric layers 40, and is electrically floating. Polymer layer 84 may have a thickness in the range between about 2 kÅ and about 5 kÅ. Over polymer layer 84 is further formed of hard mask layer 80 and anti-reflective coating 82. In accordance with some embodiments, hard mask layer 80 is formed of SiN, and has a thickness in the range between about 400 Å and about 600 Å. Anti-reflective coating 82 may be formed of SiON, and may have a thickness in the range between about 500 Å and about 700 Å.

Figure 10:
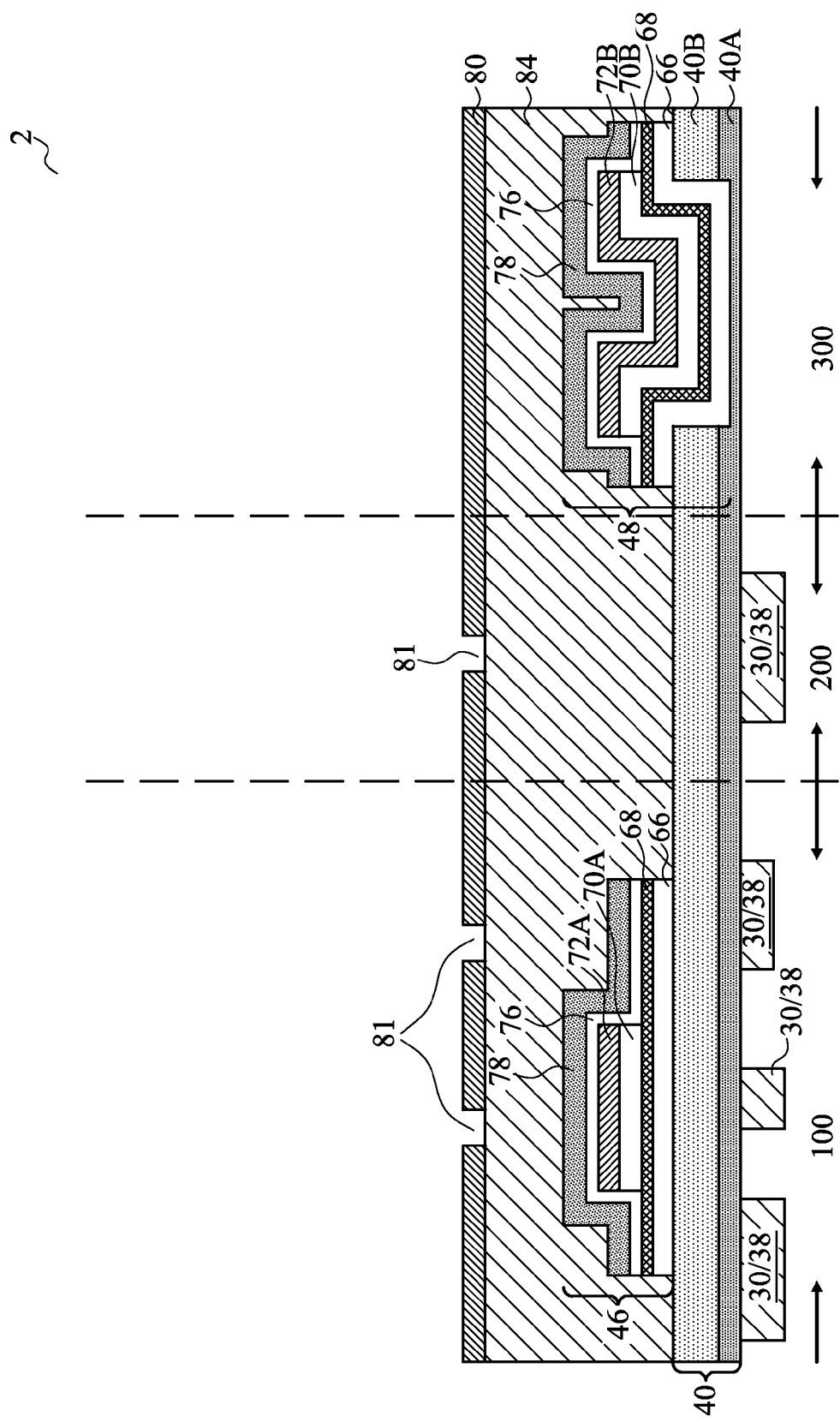
Figure 11:
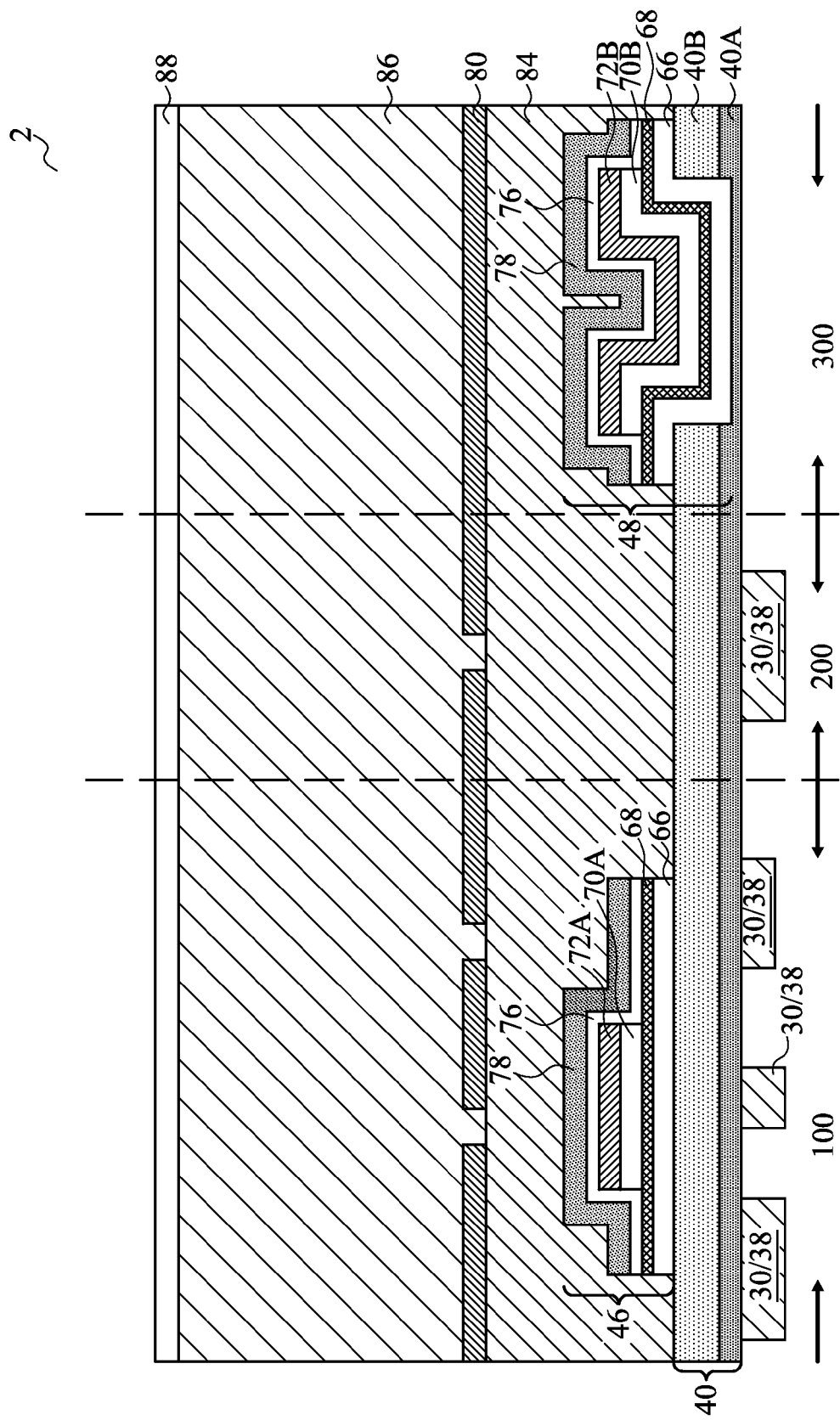

Hard mask layer 80 is then patterned, followed by the removal of anti-reflective coating 82. The resulting structure is shown in FIG. 10. Openings 81 are thus formed in hard mask layer 80, exposing the underlying polymer layer 84. In a subsequent step, as shown in FIG. 11, polymer layer 86 is formed. The steps shown in FIGS. 9 through 11 are shown as step 414 in process flow 400 illustrated in FIG. 15. Polymer layer 86 may have a thickness in the range between about 25 kÅ and about 45 kA. Polymer layers 84 and 86 may be formed of the same polymer or different polymers. Anti-reflective coating 88 is formed over polymer layer 86, and may be formed of SiON, with a thickness in the range between about 500 Å and about 700 Å.

Figure 12:
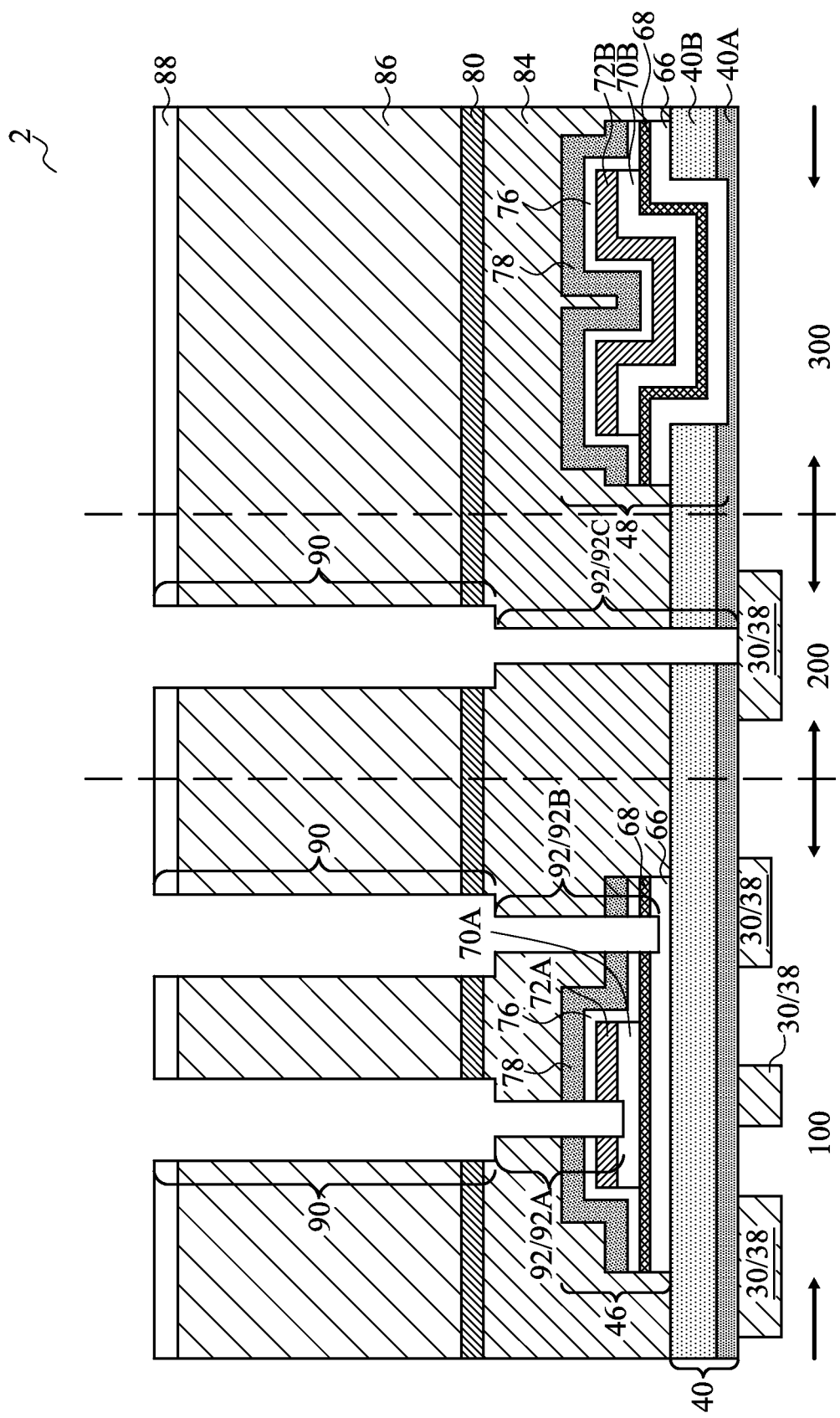

Referring to FIG. 12, a photo lithography process is performed. Anti-reflective coating 88, polymer 86, hard mask layer 80, and polymer layer 84 are patterned to form trenches 90 in polymer layer 86 and via openings 92 (including 92A, 92B, and 92C) in polymer layer 84. The patterns of via openings 92 are defined by the patterns of hard mask layer 80, and are defined by the sizes and the locations of openings 81 (FIG. 10). Accordingly, trenches 90 and via openings 92 may be formed in the same patterning process. Top electrode 70A and bottom electrode 66 are exposed to via openings 92A and 92B, respectively. One of conductive features 30/38 in logic region 200 is exposed to opening 92C.

FIG. 13A illustrates the formation of conductive vias 44A, 44B, and 44C, which are formed by filling trenches 90 and via openings 92 with a conductive material such as copper, aluminum, tungsten, cobalt, or alloys thereof. The respective step is shown as step 402 in process flow 400 illustrated in FIG. 15. The filling may be performed by a selective plating such as electro-less plating. In the resulting structure, the top surfaces of vias 44A, 44B, and 44C may be level with, slightly higher than, or slightly lower than, the top surface of polymer layer 86 or the top surface of layer 88. Conductive vias 44A, 44B, and 44C are thus electrically connected to top electrode 70A, bottom electrode 66, and conductive feature 30/38, respectively.

As shown in FIG. 13A, via 44A includes upper portion 94A in polymer layer 86 and lower portion 94B in polymer layer 84, with lower portion 94B smaller than upper portion 94A. The upper portion 94A may further penetrate through hard mask layer 80 and extend into polymer layer 84 slightly. In alternative embodiments (not shown), lower portion 94B penetrates through hard mask layer 80 and polymer layer 84, while upper portion 94A stops on the top surface of hard mask layer 80. Vias 44B and 44C have similar structures as vias 44A, except they extend deeper than via 44A. Via 44 further penetrates through dielectric layers 40A and 40B to contact the top surface of conductive feature 30/38.

FIG. 13B illustrates a top view of the structure shown in FIG. 13A, wherein the top view shapes of via portions 94A and 94B may be rectangles, circles, hexagons, or the like. In accordance with some embodiments of the present disclosure, the upper portions 94A of all vias 44 throughout the entire wafer 2 are used for interconnecting the respective lower portions 94B to the overlying RDLs, and are not used for electrical routing laterally.

Polymer layers 84 and 86 are in combination referred to as a two-step polymer layer, which is either the polymer layer 42 in the embodiments shown in FIG. 1, or the polymer layer 36 in the embodiments shown in FIG. 2.

After the formation of the structure in FIG. 14, further process may be performed to form PPI 38/50, as shown in FIG. 14. For example, when the embodiments shown in FIG. 1 are adopted, PPI 38/50 is PPI 50, while when the embodiments shown in FIG. 2 are adopted, PPI 38/50 is PPI 38. PPI 38/50 hs the function of lateral routing, unlike vias 44A, 44B, and 44C. The redistribution lines of PPI 38/50 may be connected to power supplies such as VDD and VSS.

The embodiments of the present disclosure have some advantageous features. By forming capacitors such as decoupling capacitors in polymer layers, the formation of the capacitors may be integrated with the process of wafer level chip-scale package.

In accordance with some embodiments of the present disclosure, a package includes an inorganic dielectric layer, and a capacitor. The capacitor includes a bottom electrode having a top surface in contact with a top surface of the inorganic dielectric layer, an insulator over the bottom electrode, and a top electrode over the insulator. The package further includes a polymer layer covering the capacitor, with a portion of the polymer layer being coplanar with the capacitor and encircling the capacitor. The polymer contacts the top surface of the inorganic dielectric layer.

In accordance with alternative embodiments of the present disclosure, a package includes a capacitor, which includes a bottom electrode, an insulator over the bottom electrode, and a top electrode over the insulator. A polymer layer covers the capacitor, with a portion of the polymer layer being coplanar with the capacitor and encircling the capacitor. An alignment mark has an upper portion in the polymer layer, wherein the alignment mark has same layers formed of same materials as the capacitor. The alignment mark is electrically floating.

In accordance with yet alternative embodiments of the present disclosure, a method includes forming a first conductive layer over a first dielectric layer, forming an insulator layer over the first conductive layer, and forming a second conductive layer over the insulator. The insulator layer and the second conductive layer are patterned, with each having a portion remaining. A dielectric layer is formed to cover the patterned insulator layer and the patterned second conductive layer. The first conductive layer is then patterned, with remaining portions of the second conductive layer, the insulator layer, and the first conductive layer forming a top electrode, a capacitor insulator, and a bottom electrode, respectively, of a capacitor. A polymer layer is disposed to cover the capacitor, with the first polymer layer including a portion level with the capacitor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a first conductive layer over a first dielectric layer;
   forming an insulator layer over the first conductive layer;
   forming a second conductive layer over the insulator layer;
   patterning the insulator layer and the second conductive layer, with each having a portion remaining;
   forming a dielectric layer covering the patterned insulator layer and the patterned second conductive layer;
   patterning the first conductive layer, with remaining portions of the second conductive layer, the insulator layer, and the first conductive layer forming a top electrode, a capacitor insulator, and a bottom electrode, respectively, of a capacitor;
   disposing a first polymer layer to cover the capacitor, with the first polymer layer comprising a portion level with the capacitor;
   forming a hard mask layer over the first polymer layer;
   patterning the hard mask layer to form openings;
   forming a second polymer layer over the patterned hard mask layer;
   forming contact openings in the first and the second polymer layers, with lower portions of the contact openings defined by the openings in the hard mask layer; and
   filling the contact openings with a conductive material to form a first and a second contact plug to connect to the top electrode and the bottom electrode, respectively.

2. The method of claim 1 further comprising forming an additional contact plug to penetrate through the first polymer layer, the second polymer layer, and the first dielectric layer.

3. The method of claim 1 further comprising:
   forming a redistribution line electrically connected to one of the top electrode and the bottom electrode; and
   forming a third polymer layer to embed the redistribution line therein.

4. The method of claim 1 further comprising:
   forming a redistribution line electrically connected to one of the top electrode and the bottom electrode; and
   forming a molding compound to embed the redistribution line therein.

5. The method of claim 1 further comprising:
   before the forming the first conductive layer, etching the first dielectric layer to form a first recess, wherein the first recess penetrates through the first dielectric layer to stop on a second dielectric layer, wherein the first conductive layer comprises a portion extending into the first recess, with the portion of the first conductive layer having a second recess, and wherein the patterning the insulator layer and the first conductive layer is performed using the second recess as an alignment mark.

6. The method of claim 5, wherein the first recess has a bottom at a level between a top surface and a bottom surface of the second dielectric layer.

7. A package comprising:
   an inorganic dielectric layer;
   a capacitor comprising:
     a bottom electrode having a bottom surface in contact with a top surface of the inorganic dielectric layer;
     an insulator over the bottom electrode; and
     a top electrode over the insulator;
   a first contact plug connected to the top electrode;
   a second contact plug connected to the bottom electrode, wherein each of the first and the second contact plugs comprises:
     a lower portion; and
     an upper portion with edges extending beyond respective edges of the lower portion;
   a first polymer layer covering the capacitor, wherein the first polymer layer contacts the top surface of the inorganic dielectric layer, with a portion of the first polymer layer being coplanar with the capacitor and encircling the capacitor;
   a hard mask layer over the first polymer layer; and
   a second polymer layer over the hard mask layer, wherein the upper portion of each of the first and the second contact plugs comprises a portion in the second polymer layer, and the lower portion of each of the first and the second contact plugs comprises a portion in the first polymer layer.

8. The package of claim 7 further comprising:
   a redistribution line over and in physical contact with the first contact plug, wherein the redistribution line comprises a portion overlapping the first contact plug, and the portion of the redistribution line has a substantially planar top surface.

9. The package of claim 8 further comprising a second polymer layer, with the redistribution line in the second polymer layer, wherein the substantially planar top surface is higher than a top surface of the second polymer layer.

10. The package of claim 8 further comprising a molding compound, with the redistribution line in the molding compound, wherein the substantially planar top surface is higher than a top surface of the molding compound.

11. The package of claim 7 further comprising an alignment mark comprising a bottom surface contacting the top surface of the inorganic dielectric layer, with a portion of the alignment mark penetrating through the inorganic dielectric layer.

12. The package of claim 11, wherein the portion of the alignment mark penetrating through the inorganic dielectric layer has a bottom surface contacting a top surface of an additional inorganic dielectric layer, with the additional inorganic dielectric layer underlying and in contact with the inorganic dielectric layer.

13. The package of claim 11 further comprising an additional dielectric layer underlying the inorganic dielectric layer, wherein the alignment mark further extends into the additional dielectric layer.

14. The package of claim 13, wherein the bottom surface of the alignment mark is at an intermediate level between a top surface and a bottom surface of the additional dielectric layer.

15. A package comprising:
- a capacitor comprising:
  - a bottom electrode;
  - an insulator over the bottom electrode; and
  - a top electrode over the insulator;
- a first contact plug connected to the top electrode; and
- a second contact plug connected to the bottom electrode, wherein each of the first and the second contact plugs comprises:
  - a lower portion; and
  - an upper portion wider than the lower portion;
- a first polymer layer covering the capacitor, with a portion of the first polymer layer being coplanar with the capacitor and encircling the capacitor; and
- an alignment mark comprising an upper portion in the first polymer layer, wherein the alignment mark comprises same layers formed of same materials as the capacitor, and wherein the alignment mark is electrically floating;
- a hard mask layer over the first polymer layer; and
- a second polymer layer over the hard mask layer, wherein the upper portion of each of the first and the second contact plugs comprises a portion in the second polymer layer, and the lower portion of each of the first and the second contact plugs comprises a portion in the first polymer layer.

16. The package of claim 15, wherein the upper portion of the alignment mark is coplanar with the capacitor, and wherein the alignment mark further comprises a lower portion extending below the first polymer layer.

17. The package of claim 15, wherein the upper portion of each of the first and the second contact plugs further extends into the first polymer layer.

18. The package of claim 15 further comprising an inorganic dielectric layer, with a bottom surface of the capacitor contacting a top surface of the inorganic dielectric layer, and the alignment mark further comprises a lower portion penetrating through the inorganic dielectric layer.

19. The package of claim 18 further comprising an additional dielectric layer underlying the inorganic dielectric layer, wherein the alignment mark further extends into the additional dielectric layer.

20. The package of claim 19, wherein a bottom surface of the alignment mark is at an intermediate level between a top surface and a bottom surface of the additional dielectric layer.

* * * * *